(12) United States Patent
Choi et al.

(10) Patent No.: US 10,636,462 B2
(45) Date of Patent: Apr. 28, 2020

(54) SEMICONDUCTOR DEVICES

(71) Applicant: SK hynix Inc., Icheon-si, Gyeonggi-do (KR)

(72) Inventors: Geun Ho Choi, Icheon-si (KR); Seung Wook Oh, Yongin-si (KR); Jin Il Chung, Namyangju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/287,041

(22) Filed: Feb. 27, 2019

(65) Prior Publication Data
US 2020/0105322 A1 Apr. 2, 2020

(30) Foreign Application Priority Data

Oct. 1, 2018 (KR) .......................... 10-2018-0117096

(51) Int. Cl.
*G11C 8/00* (2006.01)
*G11C 7/22* (2006.01)
*G11C 7/10* (2006.01)

(52) U.S. Cl.
CPC .............. *G11C 7/222* (2013.01); *G11C 7/109* (2013.01); *G11C 7/1054* (2013.01); *G11C 7/1093* (2013.01); *G11C 7/225* (2013.01)

(58) Field of Classification Search
CPC ............ G11C 11/40618; G11C 7/1006; G11C 7/1072
See application file for complete search history.

(56) References Cited

U.S. PATENT DOCUMENTS

| 8,984,320 B2 | 3/2015 | Bringivijayaraghavan | |
| 2008/0028127 A1* | 1/2008 | Ware | G11C 5/02 711/100 |
| 2010/0157697 A1* | 6/2010 | Sato | G11C 5/147 365/189.11 |
| 2013/0077429 A1* | 3/2013 | Kondo | G11C 7/24 365/230.06 |
| 2018/0268884 A1* | 9/2018 | Kim | G11C 7/109 |

FOREIGN PATENT DOCUMENTS

KR 100857854 B1 9/2008

* cited by examiner

*Primary Examiner* — Tuan T Nguyen
(74) *Attorney, Agent, or Firm* — William Park & Associates Ltd.

(57) ABSTRACT

A semiconductor device includes a command synthesis circuit synchronized with a first division clock signal to shift a command based on an offset signal and synchronized with a second division clock signal to generate a command synthesis signal from the shifted command. The semiconductor device also includes a strobe control signal synthesis circuit synchronized with the second division clock signal to generate a strobe synthesis signal from a strobe control signal. The semiconductor device further includes a drive control circuit generating a drive control signal from any one of the command synthesis signal and a drive signal based on the strobe synthesis signal.

22 Claims, 9 Drawing Sheets

FIG. 7
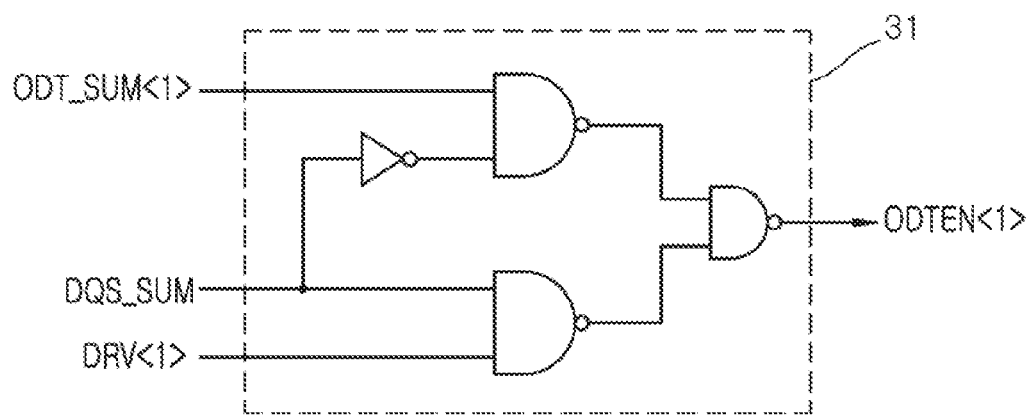
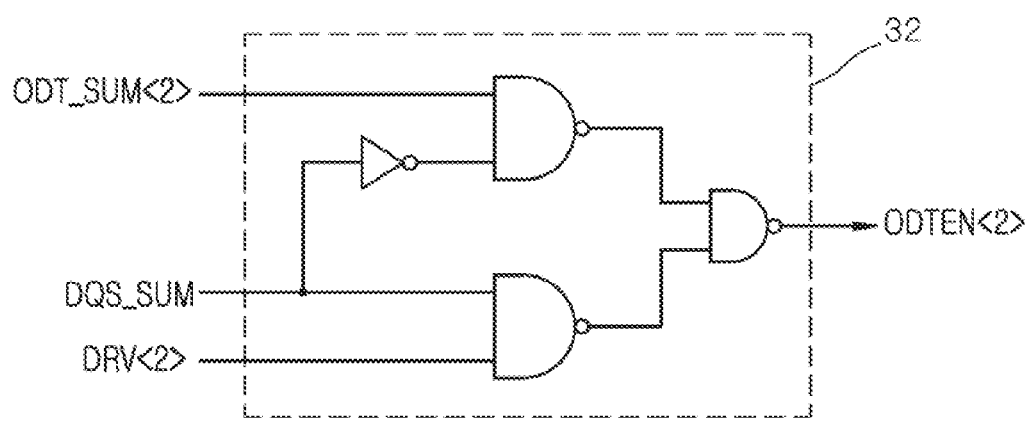

US 10,636,462 B2

SEMICONDUCTOR DEVICES

CROSS-REFERENCE TO RELATED APPLICATIONS

The present application claims priority under 35 U.S.C 119(a) to Korean Application No. 10-2018-0117096, filed on Oct. 1, 2018, which is incorporated herein by reference in its entirety.

BACKGROUND

1. Technical Field

Embodiments of the present disclosure relate to semiconductor devices performing an on-die termination operation.

2. Related Art

As a swing width of transmission signals between semiconductor devices included in a fast semiconductor system is gradually reduced, reflection of the transmission signals has occurred at interface stages between the semiconductor devices due to impedance mismatch. The impedance mismatch may occur due to variation of process condition. Thus, an impedance matching circuit (also, referred to as an "on-die termination (ODT) circuit") has been used in semiconductor systems to suppress the reflection of the transmission signals.

Meanwhile, the semiconductor devices are designed to meet conditions of some timing parameters, one of which is expressed by 'tADC' corresponding to a time period for performing an ODT operation. The timing parameter 'tADC' represents the time it takes a resistance value 'RTT' to change during the ODT operation.

SUMMARY

According to an embodiment, a semiconductor device includes a command synthesis circuit, a strobe control signal synthesis circuit, and a drive control circuit. The command synthesis circuit is synchronized with a first division clock signal to shift a command based on an offset signal and is synchronized with a second division clock signal to generate a command synthesis signal from the shifted command. The strobe control signal synthesis circuit is synchronized with the second division clock signal to generate a strobe synthesis signal from a strobe control signal. The drive control circuit generates a drive control signal from any one of the command synthesis signal and a drive signal based on the strobe synthesis signal.

According to another embodiment, a semiconductor device includes a command synthesis circuit, a strobe control signal synthesis circuit, and a drive control circuit. The command synthesis circuit is synchronized with a first division clock signal and a third division clock signal to shift a command based on an offset signal and is synchronized with a second division clock signal and a fourth division clock signal to generate a command synthesis signal from the shifted command. The strobe control signal synthesis circuit is synchronized with the second and fourth division clock signals to generate a strobe synthesis signal from a strobe control signal. The drive control circuit generates a drive control signal from any one of the command synthesis signal and a drive signal based on the strobe synthesis signal.

According to yet another embodiment, a semiconductor device includes a command synthesis circuit, a strobe control signal synthesis circuit, and a drive control circuit. The command synthesis circuit is synchronized with a first division clock signal to shift a first command or a second command based on an offset signal and is synchronized with a second division clock signal to generate a first command synthesis signal and a second command synthesis signal from the shifted command of the first command or the second command. The strobe control signal synthesis circuit is synchronized with the second division clock signal to generate a strobe synthesis signal from a strobe control signal. The drive control circuit generates a first drive control signal and a second drive control signal from the first and second command synthesis signals or first and second drive signals based on the strobe synthesis signal.

BRIEF DESCRIPTION OF THE DRAWINGS

FIG. 7 shows a circuit diagram illustrating a configuration of a drive control circuit included in the semiconductor device of FIG. 1.

DETAILED DESCRIPTION OF THE EMBODIMENTS

Various embodiments of the present disclosure are described herein with reference to the accompanying drawings. The described embodiments represent a limited number of possible embodiments and are for illustrative purposes. The described embodiments are not intended to be exhaustive or limit the scope of the present disclosure.

Figure 1:
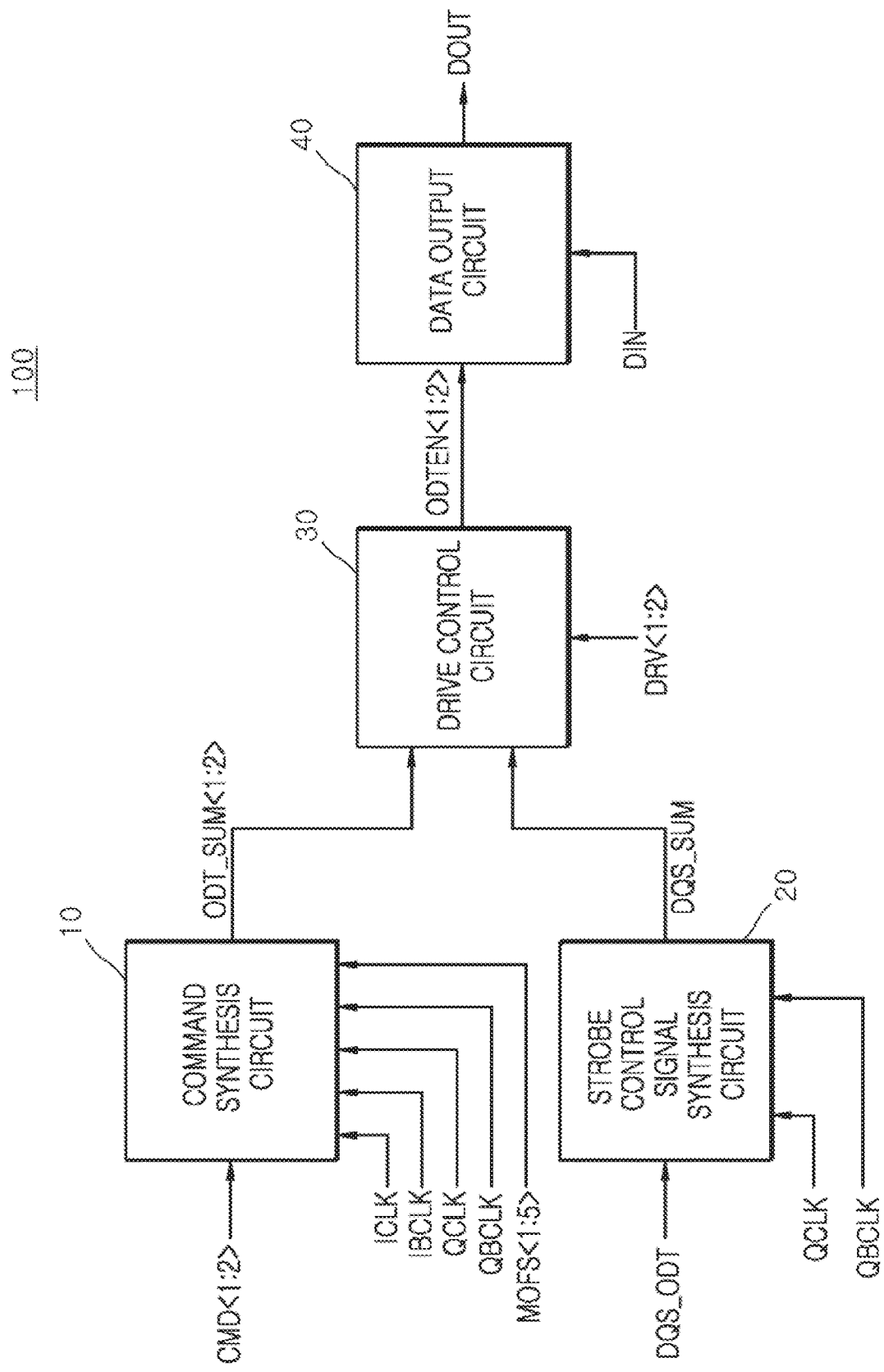
FIG. 1 shows a block diagram illustrating a configuration of a semiconductor device, according to an embodiment of the present disclosure.

As illustrated in FIG. 1, a semiconductor device 100, according to an embodiment, may include a command synthesis circuit 10, a strobe control signal synthesis circuit 20, a drive control circuit 30, and a data output circuit 40.

The command synthesis circuit 10 may be synchronized with a first division clock signal ICLK and a third division clock signal IBCLK to generate first and second command synthesis signals ODT_SUM<1:2> from first and second commands CMD<1:2> based on first to fifth offset signals MOFS<1:5>. The command synthesis circuit 10 may be synchronized with the first division clock signal ICLK and the third division clock signal IBCLK to shift the first and second commands CMD<1:2> based on first to fifth offset signals MOFS<1:5>. The command synthesis circuit 10 may be synchronized with a second division clock signal QCLK and a fourth division clock signal QBCLK to generate the first and second command synthesis signals ODT_SUM<1:2> from the shifted commands of the first and second commands CMD<1:2>. The first command CMD<1> may be set as a command for performing an on-die termination (ODT) operation of the semiconductor device 100 during a write operation of the semiconductor device 100. The second command CMD<2> may be set as a command for performing the ODT operation of the semiconductor device 100 while another semiconductor device performs a write operation. Alternatively, the second command CMD<2> may be set as a command for performing the ODT operation of the semiconductor device 100 while another semiconductor device performs a read operation. Although the present embodiment describes an example in which the first and second commands CMD<1:2> include two bits, the number of bits included in a command inputted to the command synthesis circuit 10 may be different for different embodiments. The first to fifth offset signals MOFS<1:5> may be set as a signal which is generated by a mode register set (MRS) to set a time period for shifting the first and second commands CMD<1:2>. The first to fourth division clock signals ICLK, QCLK, IBCLK, and QBCLK may be set as signals that are periodically toggled with different phases. The first division clock signal ICLK may be set to have a phase which is opposite to a phase of the third division clock signal IBCLK, and the second division clock signal QCLK may be set to have a phase which is opposite to a phase of the fourth division clock signal QBCLK.

The strobe control signal synthesis circuit 20 may be synchronized with the second division clock signal QCLK and the fourth division clock signal QBCLK to generate a strobe synthesis signal DQS_SUM from a strobe control signal DQS_ODT. The strobe control signal synthesis circuit 20 may be synchronized with the second division clock signal QCLK and the fourth division clock signal QBCLK to shift the strobe control signal DQS_ODT. The strobe control signal synthesis circuit 20 may be synchronized with the second division clock signal QCLK and the fourth division clock signal QBCLK to generate the strobe synthesis signal DQS_SUM from the shifted signal of the strobe control signal DQS_ODT. The strobe control signal DQS_ODT may be set as a signal which is enabled for the ODT operation.

The drive control circuit 30 may generate first and second drive control signals ODTEN<1:2> from the first and second command synthesis signals ODT_SUM<1:2> or first and second drive signals DRV<1:2> based on the strobe synthesis signal DQS_SUM. The drive control circuit 30 may generate the first and second drive control signals ODTEN<1:2> from the first and second command synthesis signals ODT_SUM<1:2> if the strobe synthesis signal DQS_SUM is enabled. The drive control circuit 30 may generate the first and second drive control signals ODTEN<1:2> from the first and second drive signals DRV<1:2> if the strobe synthesis signal DQS_SUM is disabled. The first and second drive signals DRV<1:2> may be set as a signal including information on a drivability for driving output data DOUT.

The data output circuit 40 may output input data DIN as the out data DOUT using the drivability which is controlled based on the first and second drive control signals ODTEN<1:2>. The data output circuit 40 may drive and output the output data DOUT with the drivability controlled based on the first and second drive control signals ODTEN<1:2>. The data output circuit 40 may perform the ODT operation based on the first and second drive control signals ODTEN<1:2> to output the output data DOUT.

Figure 2:
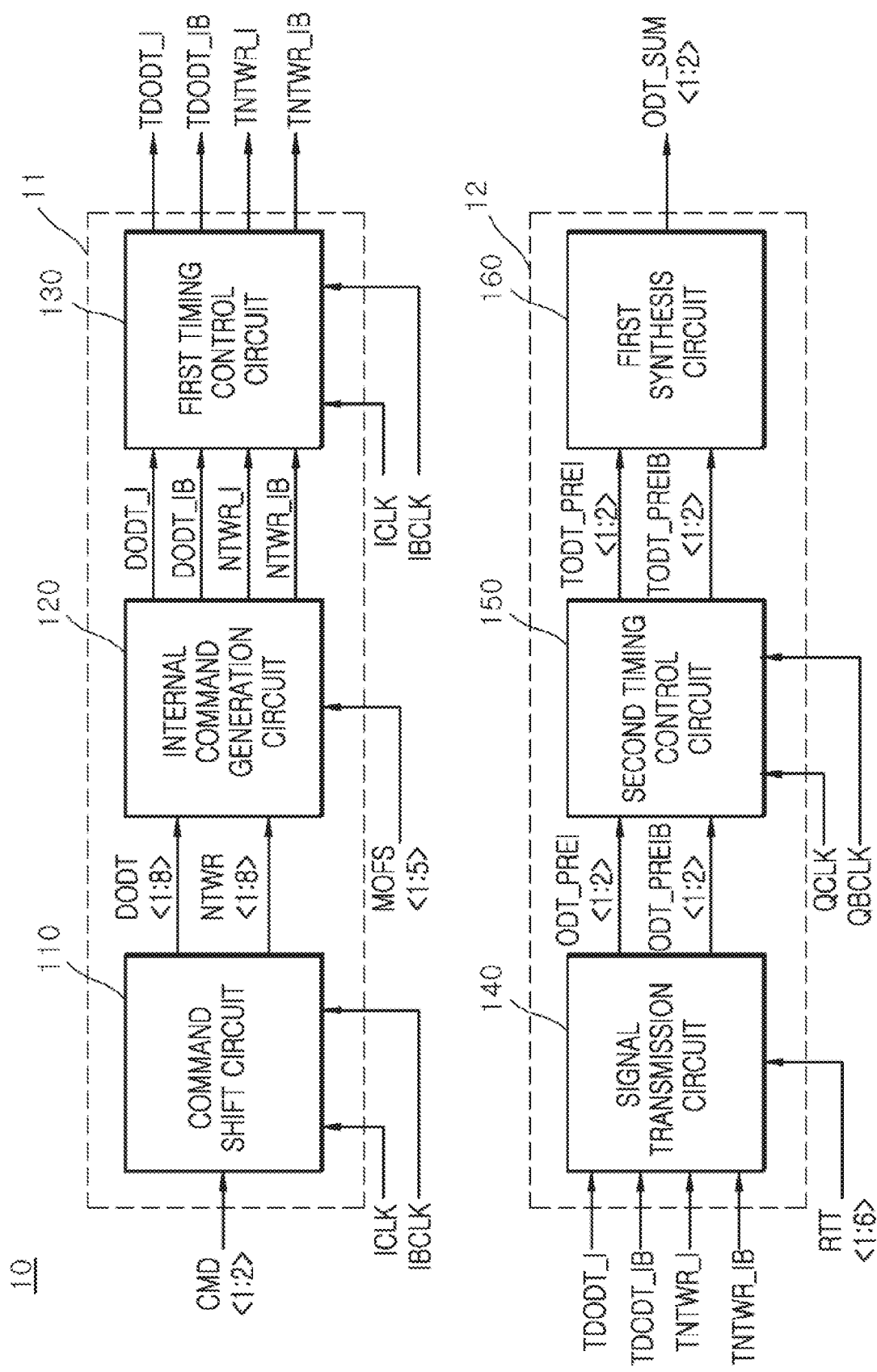
FIG. 2 shows a block diagram illustrating a configuration of a command synthesis circuit included in the semiconductor device of FIG. 1.

Referring to FIG. 2, the command synthesis circuit 10 may include a transmission command generation circuit 11 and a command synthesis signal generation circuit 12.

The transmission command generation circuit 11 may include a command shift circuit 110, an internal command generation circuit 120, and a first timing control circuit 130.

The command shift circuit 110 may shift the first command CMD<1> in synchronization with the first division clock signal ICLK and the third division clock signal IBCLK to generate first to eighth delay data commands DODT<1:8>, which are sequentially enabled.

The command shift circuit 110 may shift the second command CMD<2> in synchronization with the first division clock signal ICLK and the third division clock signal IBCLK to generate first to eighth delay write command NTWR<1:8>, which are sequentially enabled.

The internal command generation circuit 120 may generate a first internal data command DODT_I and a second internal data command DODT_IB from the first to eighth delay data commands DODT<1:8> based on the first to fifth offset signals MOFS<1:5>. The internal command generation circuit 120 may generate a first internal write command NTWR_I and a second internal write command NTWR_IB from the first to eighth delay write commands NTWR<1:8> based on the first to fifth offset signals MOFS<1:5>.

The first timing control circuit 130 may latch the first internal data command DODT_I in synchronization with the first division clock signal ICLK to output the latched command of the first internal data command DODT_I as a first transmission command TDODT_I. The first timing control circuit 130 may latch the second internal data command DODT_IB in synchronization with the third division clock signal IBCLK to output the latched command of the second internal data command DODT_IB as a second transmission command TDODT_IB. The first timing control circuit 130 may latch the first internal write command NTWR_I in synchronization with the first division clock signal ICLK to output the latched command of the first internal write command NTWR_I as a third transmission command TNTWR_I. The first timing control circuit 130 may latch the second internal write command NTWR_IB in synchronization with the third division clock signal IBCLK to output the latched command of the second internal write command NTWR_IB as a fourth transmission command TNTWR_IB.

As described above, the transmission command generation circuit 11 may shift the first command CMD<1> by a delay time set based on the first to fifth offset signals MOFS<1:5> in synchronization with the first and third division clock signals IBCLK to generate the first transmission command TDODT_I and the second transmission command TDODT_IB. The transmission command generation circuit 11 may shift the second command CMD<2> by a delay time set based on the first to fifth offset signals MOFS<1:5> in synchronization with the first and third division clock signals IBCLK to generate the third transmission command TNTWR_I and the fourth transmission command TNTWR_IB.

The command synthesis signal generation circuit 12 may include a signal transmission circuit 140, a second timing control circuit 150, and a first synthesis circuit 160.

The signal transmission circuit 140 may generate first and second pre-drive control signals ODT_PREI<1:2> from first to sixth resistance value set signals RTT<1:6> based on a logic level combination of the first and third transmission commands TDODT_I and TNTWR_I. The signal transmission circuit 140 may generate third and fourth pre-drive control signals ODT_PREIB<1:2> from the first to sixth resistance value set signals RTT<1:6> based on a logic level combination of the second and fourth transmission commands TDODT_IB and TNTWR_IB.

The second timing control circuit 150 may latch the first and second pre-drive control signals ODT_PREI<1:2> in synchronization with the second division clock signal QCLK to output the latched signals of the first and second pre-drive control signals ODT_PREI<1:2> as first and second transmission drive control signals TODT_PREI<1:2>. The second timing control circuit 150 may latch the third and fourth pre-drive control signals ODT_PREIB<1:2> in synchronization with the fourth division clock signal QBCLK to output the latched signals of the third and fourth pre-drive control signals ODT_PREIB<1:2> as third and fourth transmission drive control signals TODT_PREIB<1:2>. The second timing control circuit 150 may be realized using flip-flops.

The first synthesis circuit 160 may synthesize the first transmission drive control signal TODT_PREI<1> and the third transmission drive control signal TODT_PREIB<1> to generate the first command synthesis signal ODT_SUM<1>. The first synthesis circuit 160 may generate the first command synthesis signal ODT_SUM<1>, which is enabled if any one of the first transmission drive control signal TODT_PREI<1> and the third transmission drive control signal TODT_PREIB<1> is enabled. The first synthesis circuit 160 may buffer the first transmission drive control signal TODT_PREI<1> to generate the first command synthesis signal ODT_SUM<1>. The first synthesis circuit 160 may buffer the third transmission drive control signal TODT_PREIB<1> to generate the first command synthesis signal ODT_SUM<1>. The first synthesis circuit 160 may synthesize the second transmission drive control signal TODT_PREI<2> and the fourth transmission drive control signal TODT_PREIB<2> to generate the second command synthesis signal ODT_SUM<2>. The first synthesis circuit 160 may generate the second command synthesis signal ODT_SUM<2>, which is enabled if any one of the second transmission drive control signal TODT_PREI<2> and the fourth transmission drive control signal TODT_PREIB<2> is enabled. The first synthesis circuit 160 may buffer the second transmission drive control signal TODT_PREI<2> to generate the second command synthesis signal ODT_SUM<2>. The first synthesis circuit 160 may buffer the fourth transmission drive control signal TODT_PREIB<2> to generate the second command synthesis signal ODT_SUM<2>.

As described above, the command synthesis signal generation circuit 12 may be synchronized with the second division clock signal QCLK and the fourth division clock signal QBCLK to generate the first command synthesis signal ODT_SUM<1> from the first to sixth resistance value set signals RTT<1:6> based on logic levels of the first transmission command TDODT_I and the second transmission command TDODT_IB. The command synthesis signal generation circuit 12 may be synchronized with the second division clock signal QCLK and the fourth division clock signal QBCLK to generate the second command synthesis signal ODT_SUM<2> from the first to sixth resistance value set signals RTT<1:6> based on logic levels of the third transmission command TNTWR_I and the fourth transmission command TNTWR_IB.

Figure 3:
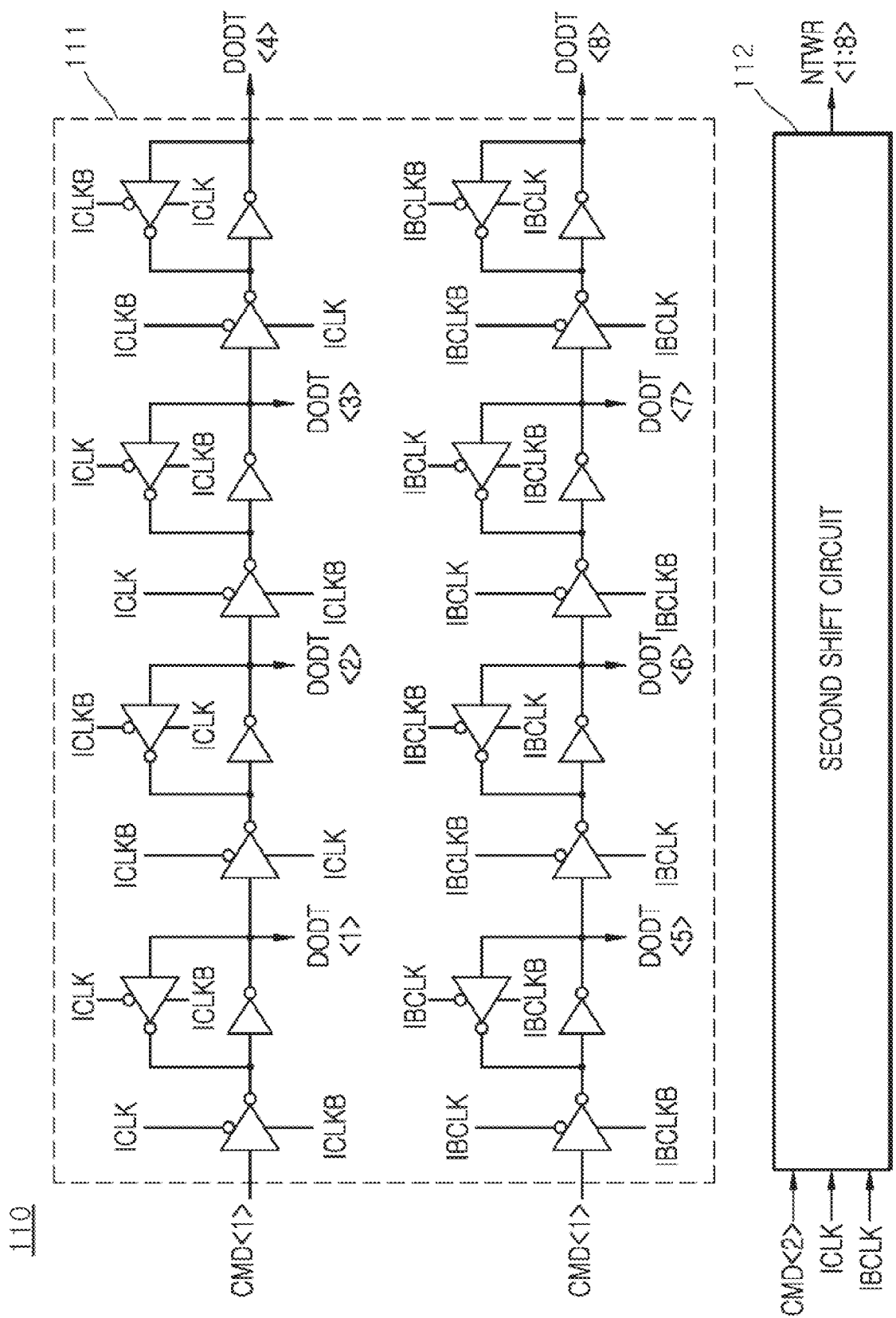
FIG. 3 illustrates a configuration of a command shift circuit included in the command synthesis circuit of FIG. 2.

Referring to FIG. 3, the command shift circuit 110 may include a first shift circuit 111 and a second shift circuit 112.

The first shift circuit 111 may shift the first command CMD<1> in synchronization with the first division clock signal ICLK and the third division clock signal IBCLK to generate the first to eighth delay data commands DODT<1:8>, which are sequentially enabled. The first shift circuit 111 may be realized using an inverter chain comprised of a plurality of cascaded inverters. In FIG. 3, a reference symbol "ICLKB" denotes an inverted signal of the first division clock signal ICLK, and a reference symbol "IBCLKB" denotes an inverted signal of the third division clock signal IBCLK.

The second shift circuit 112 may shift the second command CMD<2> in synchronization with the first division clock signal ICLK and the third division clock signal IBCLK to generate the first to eighth delay write commands NTWR<1:8>, which are sequentially enabled. The second shift circuit 112 may be realized using an inverter chain comprised of a plurality of cascaded inverters. The second shift circuit 112 may be realized using the same circuit as the first shift circuit 111 except with different input and output (I/O) signals. Thus, the second shift circuit 112 may perform substantially the same operation as the first shift circuit 111.

Figure 4:
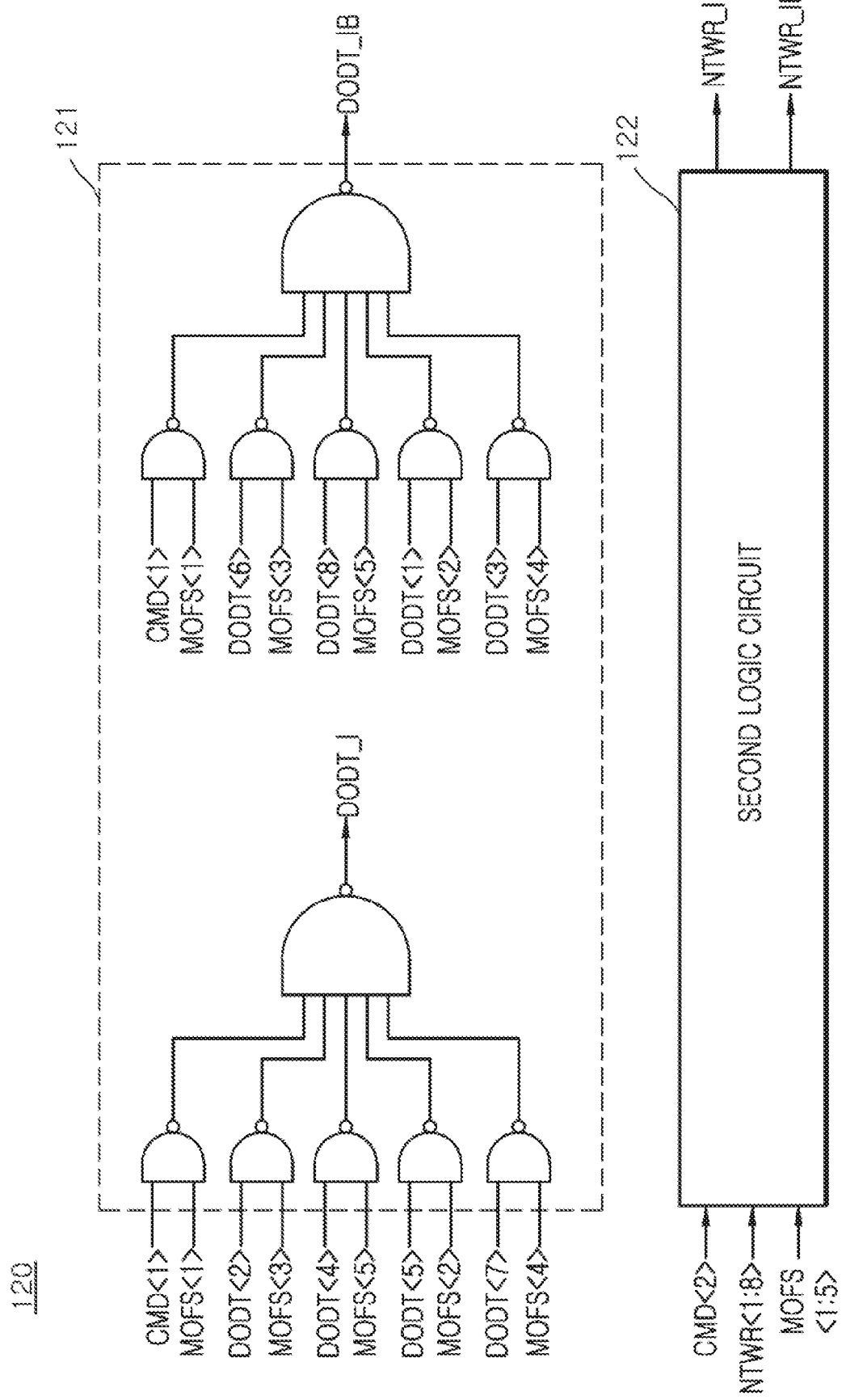
FIG. 4 illustrates a configuration of an internal command generation circuit included in the command synthesis circuit of FIG. 2.

Referring to FIG. 4, the internal command generation circuit 120 may include a first logic circuit 121 and a second logic circuit 122.

The first logic circuit 121 may generate the first internal data command DODT_I from the first command CMD<1>, the second delay data command DODT<2>, the fourth delay data command DODT<4>, the fifth delay data command DODT<5>, and the seventh delay data command DODT<7> based on the first to fifth offset signals MOFS<1:5>. The first logic circuit 121 may buffer at least one command selected from the first command CMD<1>, the second delay data command DODT<2>, the fourth delay data command DODT<4>, the fifth delay data command DODT<5>, and the seventh delay data command DODT<7> based on a logic level combination of the first to fifth offset signals MOFS<1:5> to generate the first internal data command DODT_I. The first logic circuit 121 may generate the first internal data command DODT_I, an enablement period of which is set by at least one command selected from the first command CMD<1>, the second delay data command DODT<2>, the fourth delay data command DODT<4>, the fifth delay data command DODT<5>, and the seventh delay data command DODT<7> based on a logic level combination of the first to fifth offset signals MOFS<1:5>.

The first logic circuit 121 may generate the second internal data command DODT_IB from the first command CMD<1>, the first delay data command DODT<1>, the third delay data command DODT<3>, the sixth delay data command DODT<6>, and the eighth delay data command DODT<8> based on the first to fifth offset signals MOFS<1:5>. The first logic circuit 121 may buffer at least one command selected from the first command CMD<1>, the first delay data command DODT<1>, the third delay data command DODT<3>, the sixth delay data command DODT<6>, and the eighth delay data command DODT<8> based on a logic level combination of the first to fifth offset signals MOFS<1:5> to generate the second internal data command DODT_IB. The first logic circuit 121 may generate the second internal data command DODT_IB, an enablement period of which is set by at least one command selected from the first command CMD<1>, the first delay data command DODT<1>, the third delay data command DODT<3>, the sixth delay data command DODT<6>, and the eighth delay data command DODT<8> based on a logic level combination of the first to fifth offset signals MOFS<1:5>.

The second logic circuit 122 may generate the first internal write command NTWR_I from the second command CMD<2>, the second delay write command NTWR<2>, the fourth delay write command NTWR<4>, the fifth delay write command NTWR<5>, and the seventh delay write command NTWR<7> based on the first to fifth offset signals MOFS<1:5>. The second logic circuit 122 may buffer at least one command selected from the second command CMD<2>, the second delay write command NTWR<2>, the fourth delay write command NTWR<4>, the fifth delay write command NTWR<5>, and the seventh delay write command NTWR<7> based on a logic level combination of the first to fifth offset signals MOFS<1:5> to generate the first internal write command NTWR_I. The second logic circuit 122 may generate the first internal write command NTWR_I, an enablement period of which is set by at least one command selected from the second command CMD<2>, the second delay write command NTWR<2>, the fourth delay write command NTWR<4>, the fifth delay write command NTWR<5>, and the seventh delay write command NTWR<7> based on a logic level combination of the first to fifth offset signals MOFS<1:5>.

The second logic circuit 122 may generate the second internal write command NTWR_IB from the second command CMD<2>, the first delay write command NTWR<1>, the third delay write command NTWR<3>, the sixth delay write command NTWR<6>, and the eighth delay write command NTWR<8> based on the first to fifth offset signals MOFS<1:5>. The second logic circuit 122 may buffer at least one command selected from the second command CMD<2>, the first delay write command NTWR<1>, the third delay write command NTWR<3>, the sixth delay write command NTWR<6>, and the eighth delay write command NTWR<8> based on a logic level combination of the first to fifth offset signals MOFS<1:5> to generate the second internal write command NTWR_IB. The second logic circuit 122 may generate the second internal write command NTWR_IB, an enablement period of which is set by at least one command selected from the second command CMD<2>, the first delay write command NTWR<1>, the third delay write command NTWR<3>, the sixth delay write command NTWR<6>, and the eighth delay write command NTWR<8> based on a logic level combination of the first to fifth offset signals MOFS<1:5>. The second logic circuit 122 may be realized using the same circuit as the first logic circuit 121 except with different I/O signals. Thus, the second logic circuit 122 may perform substantially the same operation as the first logic circuit 121.

Figure 5:
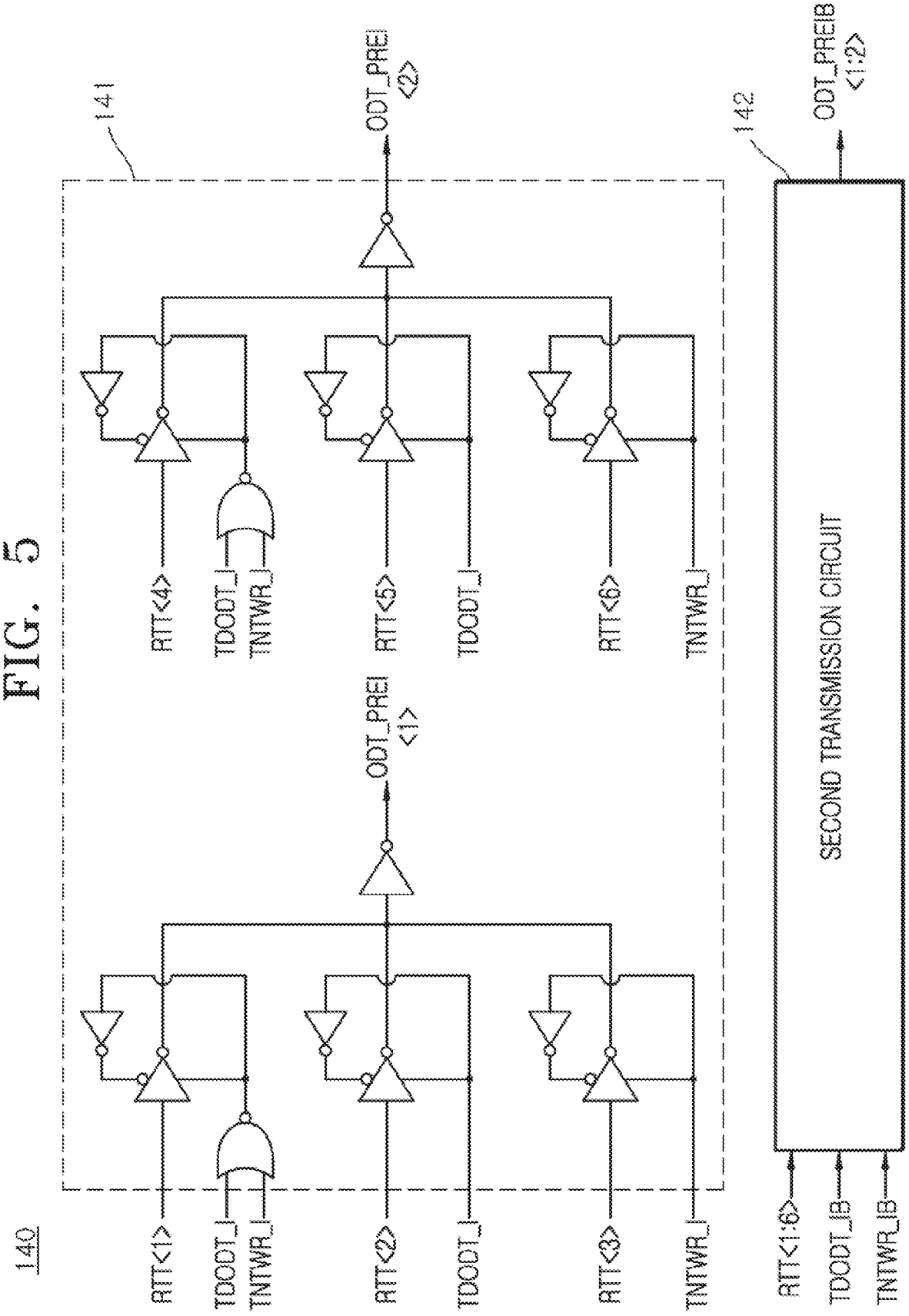
FIG. 5 illustrates a configuration of a signal transmission circuit included in the command synthesis circuit of FIG. 2.

Referring to FIG. 5, the signal transmission circuit 140 may include a first transmission circuit 141 and a second transmission circuit 142.

The first transmission circuit 141 may generate the first pre-drive control signal ODT_PREI<1> from the first resistance value set signal RTT<1> if the first transmission command TDODT_I is disabled to have a logic "low" level and the third transmission command TNTWR_I is disabled to have a logic "low" level. The first transmission circuit 141 may generate the first pre-drive control signal ODT_PREI<1> from the second resistance value set signal RTT<2> if the first transmission command TDODT_I is enabled to have a logic "high" level. The first transmission circuit 141 may generate the first pre-drive control signal ODT_PREI<1> from the third resistance value set signal RTT<3> if the third transmission command TNTWR_I is enabled to have a logic "high" level. The first resistance value set signal RTT<1> may be set as a signal including information on a first resistance value. The first resistance value means a resistance value of a path through which the output data DOUT are outputted. The second resistance value set signal RTT<2> may be set as a signal including information on a second resistance value. The second resistance value means a resistance value of a path through which the output data DOUT are outputted. The third resistance value set signal RTT<3> may be set as a signal including information on a third resistance value. The third resistance value means a resistance value of a path through which the output data DOUT are outputted. The first, second, and third resistance values may be set to have different values based on variation of environmental conditions, for example, variations of processes, voltages, and/or temperatures (PVT). In addition, each of the first, second, and third resistance values may also be different in different embodiments. Although the first to third resistance value set signals RTT<1:3> each include one bit as described, the number of bits included in each of the first to third resistance value set signals RTT<1:3> may be two or more for different embodiments.

The first transmission circuit 141 may generate the second pre-drive control signal ODT_PREI<2> from the fourth resistance value set signal RTT<4> if the first transmission command TDODT_I is disabled to have a logic "low" level and the third transmission command TNTWR_I is disabled to have a logic "low" level. The first transmission circuit 141 may generate the second pre-drive control signal ODT_PREI<2> from the fifth resistance value set signal RTT<5> if the first transmission command TDODT_I is enabled to have a logic "high" level. The first transmission circuit 141 may generate the second pre-drive control signal ODT_PREI<2> from the sixth resistance value set signal RTT<6> if the third transmission command TNTWR_I is enabled to have a logic "high" level. The fourth resistance value set signal RTT<4> may be set as a signal including information on a fourth resistance value. The fourth resistance value means a resistance value of a path through which the output data DOUT are outputted. The fifth resistance value set signal RTT<5> may be set as a signal including information on a fifth resistance value. The fifth resistance value means a resistance value of a path through which the output data DOUT are outputted. The sixth resistance value set signal RTT<6> may be set as a signal including information on a sixth resistance value. The sixth resistance value means a resistance value of a path through which the output data DOUT are outputted. The fourth, fifth, and sixth resistance values may be set to have different values based on variation of environmental conditions, for example, variations of processes, voltages, and/or temperatures (PVT). In addition, each of the fourth, fifth, and sixth resistance values may also be different for different embodiments. Although the fourth to sixth resistance value set signals RTT<4:6> each include one bit as described, the number of bits included in each of the fourth to sixth resistance value set signals RTT<4:6> may be two or more for different embodiments.

The second transmission circuit 142 may generate the third pre-drive control signal ODT_PREIB<1> from the first resistance value set signal RTT<1> if the second transmission command TDODT_IB is disabled to have a logic "low" level and the fourth transmission command TNTWR_IB is disabled to have a logic "low" level. The second transmission circuit 142 may generate the third pre-drive control signal ODT_PREIB<1> from the second resistance value set signal RTT<2> if the second transmission command TDODT_IB is enabled to have a logic "high" level. The second transmission circuit 142 may generate the third pre-drive control signal ODT_PREIB<1> from the third resistance value set signal RTT<3> if the fourth transmission command TNTWR_IB is enabled to have a logic "high" level.

The second transmission circuit 142 may generate the fourth pre-drive control signal ODT_PREIB<2> from the fourth resistance value set signal RTT<4> if the second transmission command TDODT_IB is disabled to have a logic "low" level and the fourth transmission command TNTWR_IB is disabled to have a logic "low" level. The second transmission circuit 142 may generate the fourth pre-drive control signal ODT_PREIB<2> from the fifth resistance value set signal RTT<5> if the second transmission command TDODT_IB is enabled to have a logic "high" level. The second transmission circuit 142 may generate the fourth pre-drive control signal ODT_PREIB<2> from the sixth resistance value set signal RTT<6> if the fourth transmission command TNTWR_IB is enabled to have a logic "high" level. The second transmission circuit 142 may be realized using the same circuit as the first transmission circuit 141 except with different I/O signals. Thus, the second transmission circuit 142 may perform substantially the same operation as the first transmission circuit 141.

Figure 6:
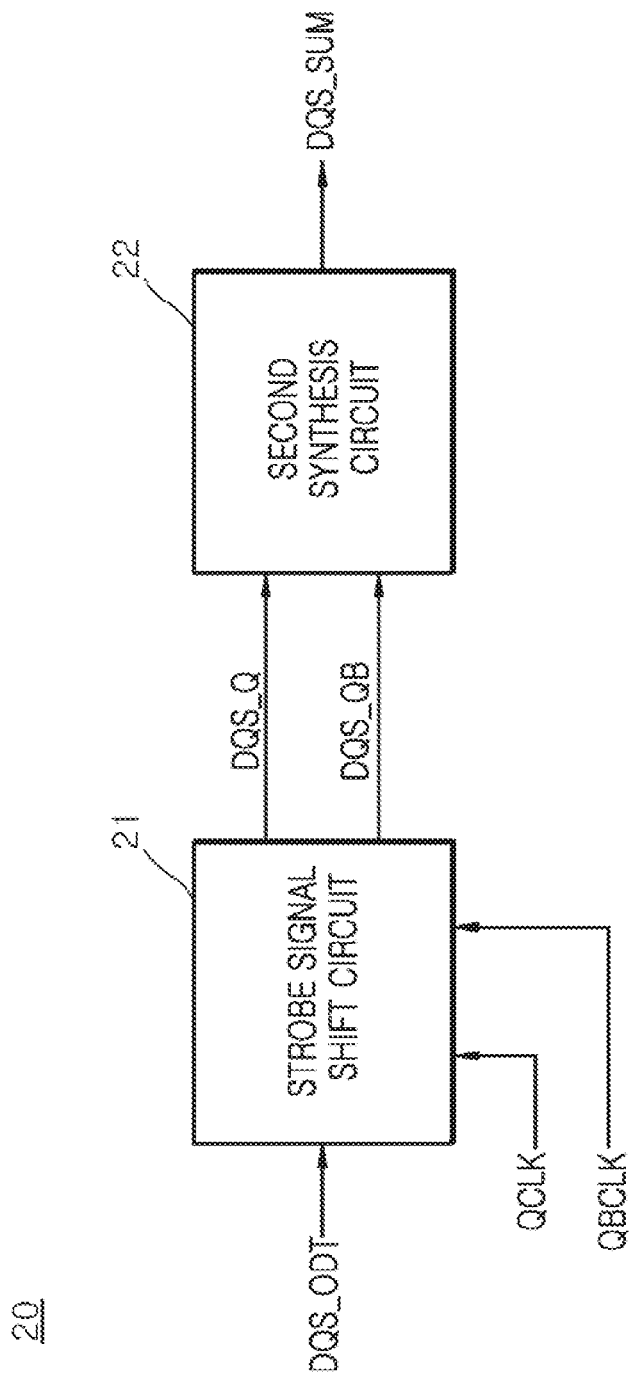
FIG. 6 shows a block diagram illustrating a configuration of a strobe control signal synthesis circuit included in the semiconductor device of FIG. 1.

Referring to FIG. 6, the strobe control signal synthesis circuit may include a strobe signal shift circuit 21 and a second synthesis circuit 22.

The strobe signal shift circuit 21 may shift the strobe control signal DQS_ODT in synchronization with the second division clock signal QCLK to generate a first transmission strobe control signal DQS_Q. The strobe signal shift circuit 21 may shift the strobe control signal DQS_ODT in synchronization with the fourth division clock signal QBCLK to generate a second transmission strobe control signal DQS_QB. A shift time for shifting the strobe control signal DQS_ODT may be set differently for different embodiments.

The second synthesis circuit 22 may synthesize the first transmission strobe control signal DQS_Q and the second transmission strobe control signal DQS_QB to generate the strobe synthesis signal DQS_SUM. The second synthesis circuit 22 may generate the strobe synthesis signal DQS_SUM, which is enabled if any one of the first transmission strobe control signal DQS_Q and the second transmission strobe control signal DQS_QB is enabled. The second synthesis circuit 22 may buffer the first transmission strobe control signal DQS_Q to generate the strobe synthesis signal DQS_SUM. The second synthesis circuit 22 may buffer the second transmission strobe control signal DQS_QB to generate the strobe synthesis signal DQS_SUM.

Referring to FIG. 7, the drive control circuit 30 may include a first drive control circuit 31 and a second drive control circuit 32.

The first drive control circuit 31 may generate the first drive control signal ODTEN<1> from any one of the first command synthesis signal ODT_SUM<1> and the first drive signal DRV<1> based on the strobe synthesis signal DQS_SUM. The first drive control circuit 31 may buffer the first drive signal DRV<1> to generate the first drive control signal ODTEN<1> if the strobe synthesis signal DQS_SUM is disabled to have a logic "high" level. In such a case, the first drive control signal ODTEN<1> may be generated to include information on the drivability for driving the output data DOUT. The first drive control circuit 31 may buffer the first command synthesis signal ODT_SUM<1> to generate the first drive control signal ODTEN<1> if the strobe synthesis signal DQS_SUM is enabled to have a logic "low" level. In such a case, the first drive control signal ODTEN<1> may be generated to include information on an external resistance value.

The second drive control circuit 32 may generate the second drive control signal ODTEN<2> from any one of the second command synthesis signal ODT_SUM<2> and the second drive signal DRV<2> based on the strobe synthesis signal DQS_SUM. The second drive control circuit 32 may buffer the second drive signal DRV<2> to generate the second drive control signal ODTEN<2> if the strobe synthesis signal DQS_SUM is disabled to have a logic "high" level. In such a case, the second drive control signal ODTEN<2> may be generated to include information on the drivability for driving the output data DOUT. The second drive control circuit 32 may buffer the second command synthesis signal ODT_SUM<2> to generate the second drive control signal ODTEN<2> if the strobe synthesis signal DQS_SUM is enabled to have a logic "low" level. In such a case, the second drive control signal ODTEN<2> may be generated to include information on the external resistance value.

Figure 8:
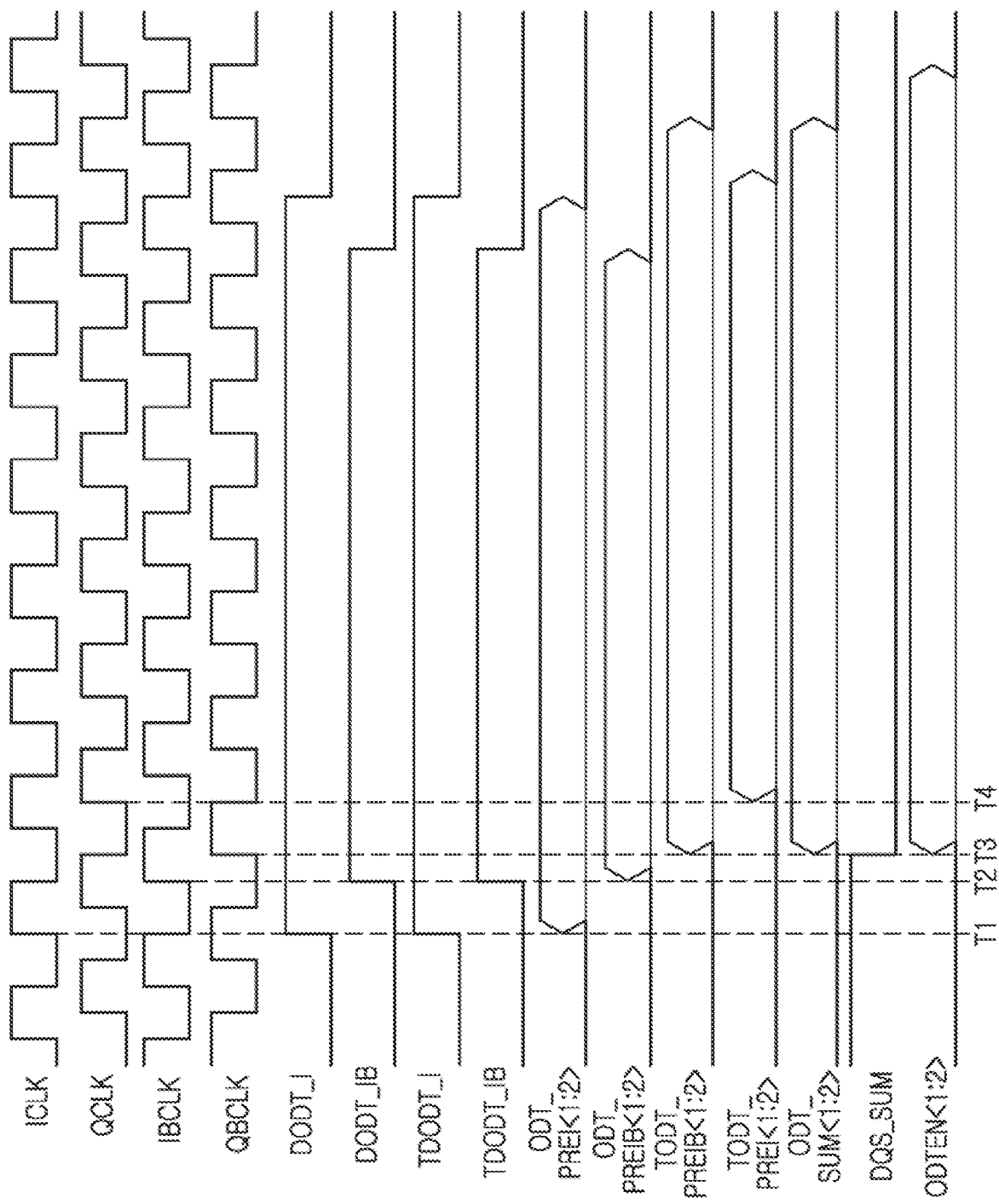
FIG. 8 shows a timing diagram illustrating an operation of a semiconductor device, according to an embodiment of the present disclosure.

An operation of the semiconductor device 100, according to an embodiment, is described hereinafter with reference to FIG. 8 in conjunction with an example in which the first and second drive control signals ODTEN<1:2> are generated from the first command CMD<1> to perform the ODT operation.

First, phase differences between the first to fourth division clock signals ICLK, QCLK, IBCLK, and QBCLK are described prior to explanation about the operation of the semiconductor device 100.

The first division clock signal ICLK may be generated to have an opposite phase to the third division clock signal IBCLK. The second division clock signal QCLK may be generated to have an opposite phase to the fourth division clock signal QBCLK. The first division clock signal ICLK may be generated to precede the second division clock signal QCLK by a phase of 90 degrees. The second division clock signal QCLK may be generated to precede the third division clock signal IBCLK by a phase of 90 degrees. The third division clock signal IBCLK may be generated to precede the fourth division clock signal QBCLK by a phase of 90 degrees.

At a point of time "T1," the command shift circuit 110 may shift the first command CMD<1> in synchronization with the first division clock signal ICLK to generate the first to eighth delay data commands DODT<1:8>, which are sequentially enabled.

The internal command generation circuit 120 may generate the first internal data command DODT_I having a logic "high" level from the first to eighth delay data commands DODT<1:8> based on the first to fifth offset signals MOFS<1:5>. An enablement period of the first internal data command DODT_I may be determined based on a logic level combination of the first to fifth offset signals MOFS<1:5>.

The first timing control circuit 130 may latch the first internal data command DODT_I in synchronization with the first division clock signal ICLK to output the latched command of the first internal data command DODT_I as the first transmission command TDODT_I.

The first transmission circuit 141 may generate the first pre-drive control signal ODT_PREI<1> from the second resistance value set signal RTT<2> because the first transmission command TDODT_I is enabled to have a logic "high" level. The first transmission circuit 141 may generate the second pre-drive control signal ODT_PREI<2> from the fifth resistance value set signal RTT<5> because the first transmission command TDODT_I is enabled to have a logic "high" level.

At a point of time "T2," the internal command generation circuit 120 may generate the second internal data command DODT_IB having a logic "high" level from the first to eighth delay data commands DODT<1:8> based on the first to fifth offset signals MOFS<1:5>. An enablement period of the second internal data command DODT_IB may be determined based on a logic level combination of the first to fifth offset signals MOFS<1:5>.

The first timing control circuit 130 may latch the second internal data command DODT_IB in synchronization with the third division clock signal IBCLK to output the latched command of the third internal data command DODT_IB as the second transmission command TDODT_IB.

The second transmission circuit 142 may generate the third pre-drive control signal ODT_PREIB<1> from the second resistance value set signal RTT<2> because the second transmission command TDODT_IB is enabled to have a logic "high" level. The second transmission circuit 142 may generate the fourth pre-drive control signal ODT_PREIB<2> from the fifth resistance value set signal RTT<5> because the second transmission command TDODT_IB is enabled to have a logic "high" level.

At a point of time "T3," the second timing control circuit 150 may latch the third pre-drive control signals ODT_PREIB<1> in synchronization with the fourth division clock signal QBCLK to generate the third transmission drive control signal TODT_PREIB<1>. The second timing control circuit 150 may latch the fourth pre-drive control signals ODT_PREIB<2> in synchronization with the fourth division clock signal QBCLK to generate the fourth transmission drive control signal TODT_PREIB<2>.

The first synthesis circuit 160 may buffer the third transmission drive control signal TODT_PREIB<1> to generate the first command synthesis signal ODT_SUM<1>. The first synthesis circuit 160 may buffer the fourth transmission drive control signal TODT_PREIB<2> to generate the second command synthesis signal ODT_SUM<2>.

The strobe signal shift circuit 21 may shift the strobe control signal DQS_ODT in synchronization with the fourth division clock signal QBCLK to generate the second transmission strobe control signal DQS_QB having a logic "low" level.

The second synthesis circuit 22 may buffer the second transmission strobe control signal DQS_QB to generate the strobe synthesis signal DQS_SUM having a logic "low" level.

The first drive control circuit 31 may buffer the first command synthesis signal ODT_SUM<1> to generate the first drive control signal ODTEN<1> based on the strobe synthesis signal DQS_SUM having a logic "low" level. The first drive control circuit 31 may buffer the second command synthesis signal ODT_SUM<2> to generate the second drive control signal ODTEN<2> based on the strobe synthesis signal DQS_SUM having a logic "low" level.

The data output circuit 40 may output the input data DIN as the out data DOUT using the drivability which is controlled based on the first and second drive control signals ODTEN<1:2>. That is, the data output circuit 40 may perform the ODT operation based on the first and second drive control signals ODTEN<1:2> to output the output data DOUT.

At a point of time "T4," the second timing control circuit 150 may latch the first pre-drive control signals ODT_PREI<1> in synchronization with the second division clock signal QCLK to generate the first transmission drive control signal TODT_PREI<1> having a logic "high" level. The second timing control circuit 150 may latch the second pre-drive control signals ODT_PREI<2> in synchronization with the second division clock signal QCLK to generate the second transmission drive control signal TODT_PREI<2> having a logic "high" level.

The first synthesis circuit 160 may buffer the first transmission drive control signal TODT_PREI<1> to generate the first command synthesis signal ODT_SUM<1>. The first synthesis circuit 160 may buffer the second transmission drive control signal TODT_PREI<2> to generate the second command synthesis signal ODT_SUM<2>.

The first drive control circuit 31 may buffer the first command synthesis signal ODT_SUM<1> to generate the first drive control signal ODTEN<1> based on the strobe synthesis signal DQS_SUM having a logic "low" level. The first drive control circuit 31 may buffer the second command synthesis signal ODT_SUM<2> to generate the second drive control signal ODTEN<2> based on the strobe synthesis signal DQS_SUM having a logic "low" level.

The data output circuit 40 may output the input data DIN as the out data DOUT using the drivability which is controlled based on the first and second drive control signals ODTEN<1:2>. That is, the data output circuit 40 may perform the ODT operation based on the first and second drive control signals ODTEN<1:2> to output the output data DOUT.

As described above, the semiconductor device 100 according to an embodiment may prevent the mismatch between the command synthesis signal and the strobe synthesis signal by latching the command synthesis signal and the strobe synthesis signal, which are generated through different paths, in synchronization with the same division clock signal. In addition, the semiconductor device 100 according to an embodiment may provide the timing parameter 'tADC' having a desired range by latching the command synthesis signal and the strobe synthesis signal, which are generated through different paths, in synchronization with the same division clock signal and by generating signals for performing the ODT operation from the latched signals of the command synthesis signal and the strobe synthesis signal.

Figure 9:
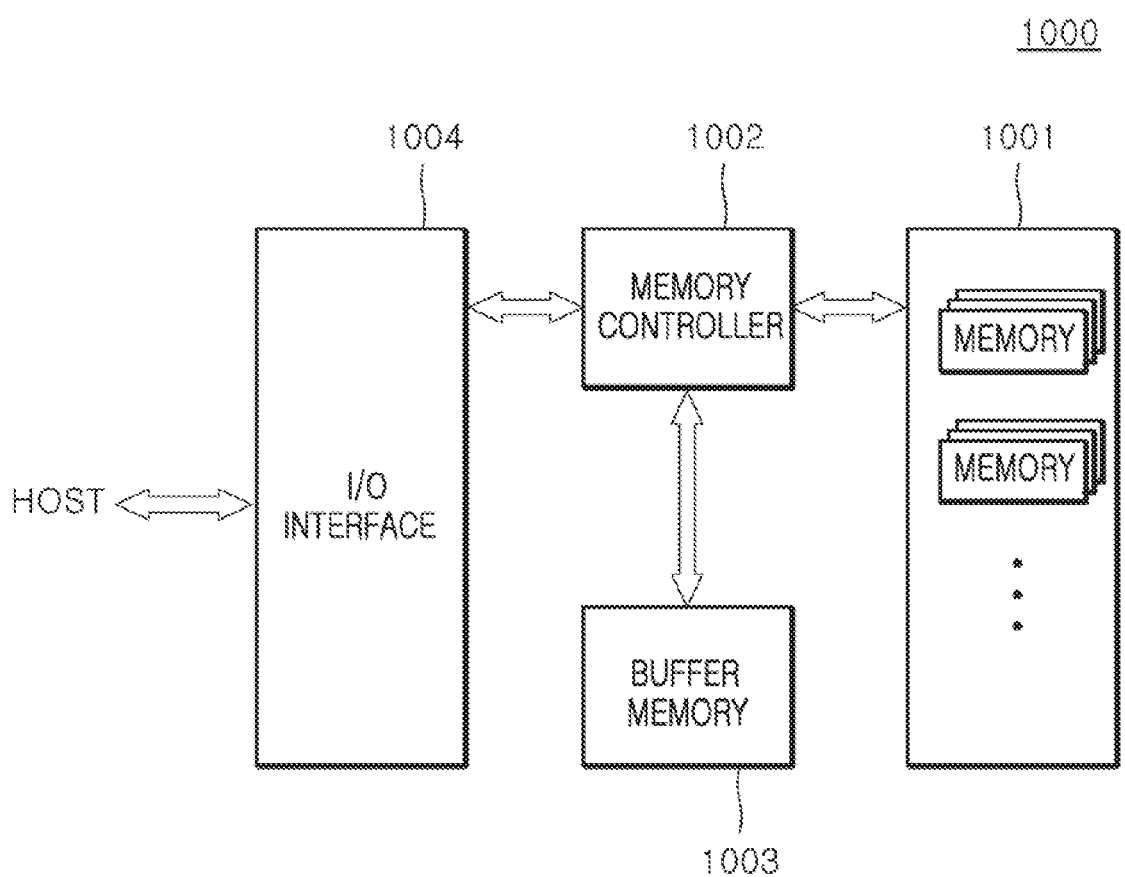
FIG. 9 shows a block diagram illustrating a configuration of an electronic system employing the semiconductor device shown in FIGS. 1 to 8.

The semiconductor device 100 described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an I/O interface 1004.

The data storage circuit 1001 may store data which are outputted from the memory controller 1002 or may read and output the stored data to the memory controller 1002, based on a control signal outputted from the memory controller 1002. The data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting data stored in the data storage circuit 1001 or the buffer memory 1003. Although FIG. 9 illustrates the memory controller 1002 with a single block, the memory controller 1002 may include one controller for controlling the data storage circuit 1001 having nonvolatile memory and another controller for controlling the buffer memory 1003 having volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may include the memory device illustrated in FIG. 1. The buffer memory 1003 may store the data, which are outputted from the memory controller 1002, based on a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or as an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. A semiconductor device comprising:
a command synthesis circuit configured to be synchronized with a first division clock signal to shift a command based on an offset signal and configured to be synchronized with a second division clock signal to generate a command synthesis signal from the shifted command;
a strobe control signal synthesis circuit configured to be synchronized with the second division clock signal to generate a strobe synthesis signal from a strobe control signal; and
a drive control circuit configured to generate a drive control signal from any one of the command synthesis signal and a drive signal based on the strobe synthesis signal.
2. The semiconductor device of claim 1,
wherein the command synthesis signal includes information on an external resistance value; and
wherein the drive signal includes information on a drivability for driving output data.

3. The semiconductor device of claim 1, wherein the first and second division clock signals have different phases.
4. The semiconductor device of claim 1, wherein the command synthesis circuit comprises:
a transmission command generation circuit configured to shift the command by a delay time set by the offset signal in synchronization with the first division clock signal to generate a transmission command; and
a command synthesis signal generation circuit configured to be synchronized with the second division clock signal to generate the command synthesis signal from a resistance value set signal based on a logic level of the transmission command.
5. The semiconductor device of claim 4, wherein the transmission command generation circuit comprises:
a command shift circuit configured to shift the command in synchronization with the first division clock signal to generate a plurality of delay data commands;
an internal command generation circuit configured to generate an internal data command from the plurality of delay data commands based on the offset signal; and
a first timing control circuit configured to latch the internal data command in synchronization with the first division clock signal to output the latched internal data command as the transmission command.
6. The semiconductor device of claim 4, wherein the command synthesis signal generation circuit comprises:
a signal transmission circuit configured to output the resistance value set signal as a pre-drive control signal when the transmission command is enabled;
a second timing control circuit configured to latch the pre-drive control signal in synchronization with the second division clock signal to output the latched pre-drive control signal as a transmission drive control signal; and
a first synthesis circuit configured to buffer the transmission drive control signal to output the buffered transmission drive control signal as the command synthesis signal.
7. The semiconductor device of claim 1, wherein the strobe control signal synthesis circuit comprises:
a strobe signal shift circuit configured to shift the strobe control signal in synchronization with the second division clock signal to generate a transmission strobe control signal; and
a second synthesis circuit configured to buffer the transmission strobe control signal to output the buffered transmission strobe control signal as the strobe synthesis signal.
8. A semiconductor device comprising:
a command synthesis circuit configured to be synchronized with a first division clock signal and a third division clock signal to shift a command based on an offset signal and configured to be synchronized with a second division clock signal and a fourth division clock signal to generate a command synthesis signal from the shifted command;
a strobe control signal synthesis circuit configured to be synchronized with the second and fourth division clock signals to generate a strobe synthesis signal from a strobe control signal; and
a drive control circuit configured to generate a drive control signal from any one of the command synthesis signal and a drive signal based on the strobe synthesis signal.

9. The semiconductor device of claim 8,
wherein the command synthesis signal includes information on an external resistance value; and
wherein the drive signal includes information on a drivability for driving output data.

10. The semiconductor device of claim 8,
wherein phases of the first, second, third, and fourth division clock signals are different from each other;
wherein the phase of the first division clock signal is opposite to the phase of the third division clock signal; and
wherein the phase of the second division clock signal is opposite to the phase of the fourth division clock signal.

11. The semiconductor device of claim 8, wherein the command synthesis circuit comprises:
a transmission command generation circuit configured to shift the command by a delay time set by the offset signal in synchronization with the first and third division clock signals to generate a first transmission command and a second transmission command; and
a command synthesis signal generation circuit configured to be synchronized with the second and fourth division clock signals to generate the command synthesis signal from a resistance value set signal based on logic levels of the first and second transmission commands.

12. The semiconductor device of claim 11, wherein the first transmission command is generated in synchronization with the first division clock signal, and wherein the second transmission command is generated in synchronization with the third division clock signal.

13. The semiconductor device of claim 11, wherein the transmission command generation circuit comprises:
a command shift circuit configured to shift the command in synchronization with the first and third division clock signals to generate a plurality of delay data commands;
an internal command generation circuit configured to generate a first internal data command and a second internal data command from the plurality of delay data commands based on the offset signal; and
a first timing control circuit configured to latch the first and second internal data commands in synchronization with the first and third division clock signals to output the latched commands of the first and second internal data commands as the first and second transmission commands.

14. The semiconductor device of claim 11, wherein the command synthesis signal generation circuit comprises:
a signal transmission circuit configured to output the resistance value set signal as a first pre-drive control signal and a second pre-drive control signal when the first and second transmission commands are enabled;
a second timing control circuit configured to latch the first and second pre-drive control signals in synchronization with the second division clock signal to output the latched signals of the first and second pre-drive control signals as a first transmission drive control signal and a second transmission drive control signal; and
a first synthesis circuit configured to synthesize the first and second transmission drive control signals to output the synthesized signal of the first and second transmission drive control signals as the command synthesis signal.

15. The semiconductor device of claim 14, wherein the signal transmission circuit comprises:

a first transmission circuit configured to output the resistance value set signal as the first pre-drive control signal when the first transmission command is enabled; and
a second transmission circuit configured to output the resistance value set signal as the second pre-drive control signal when the second transmission command is enabled.

16. The semiconductor device of claim 8, wherein the strobe control signal synthesis circuit comprises:
a strobe signal shift circuit configured to shift the strobe control signal in synchronization with the second and fourth division clock signals to generate a first transmission strobe control signal and a second transmission strobe control signal; and
a second synthesis circuit configured to synthesize the first and second transmission strobe control signals to output the synthesized signal of the first and second transmission strobe control signals as the strobe synthesis signal.

17. The semiconductor device of claim 8,
wherein the drive control circuit generates the drive control signal from the command synthesis signal when the strobe synthesis signal is enabled; and
wherein the drive control circuit generates the drive control signal from the drive signal when the strobe synthesis signal is disabled.

18. A semiconductor device comprising:
a command synthesis circuit configured to be synchronized with a first division clock signal to shift a first command or a second command based on an offset signal and configured to be synchronized with a second division clock signal to generate a first command synthesis signal and a second command synthesis signal from the shifted command of the first command or the second command;
a strobe control signal synthesis circuit configured to be synchronized with the second division clock signal to generate a strobe synthesis signal from a strobe control signal; and
a drive control circuit configured to generate a first drive control signal and a second drive control signal from the first and second command synthesis signals or first and second drive signals based on the strobe synthesis signal.

19. The semiconductor device of claim 18, wherein the command synthesis circuit comprises:
a transmission command generation circuit configured to shift the first or second command by a delay time set by the offset signal in synchronization with the first division clock signal to generate a first transmission command and a second transmission command; and
a command synthesis signal generation circuit configured to be synchronized with the second division clock signal to generate the first and second command synthesis signals from a resistance value set signal based on logic levels of the first and second transmission commands.

20. The semiconductor device of claim 19, wherein the transmission command generation circuit comprises:
a command shift circuit configured to shift the first command in synchronization with the first division clock signal to generate a plurality of delay data commands and configured to shift the second command in synchronization with the first division clock signal to generate a plurality of delay write commands;

an internal command generation circuit configured to generate an internal data command from the plurality of delay data commands based on the offset signal and configured to generate an internal write command from the plurality of delay write commands based on the offset signal; and a first timing control circuit configured to latch the internal data command in synchronization with the first division clock signal to output the latched internal data command as the first transmission command and configured to latch the internal write command in synchronization with the first division clock signal to output the latched internal write command as the second transmission command.

21. The semiconductor device of claim 19, wherein the command synthesis signal generation circuit comprises:

a signal transmission circuit configured to output the resistance value set signal as a first pre-drive control signal when the first transmission command is enabled and configured to output the resistance value set signal as a second pre-drive control signal when the second transmission command is enabled;

a second timing control circuit configured to latch the first pre-drive control signal in synchronization with the second division clock signal to output the latched signal of the first pre-drive control signal as a first transmission drive control signal and configured to latch the second pre-drive control signal in synchronization with the second division clock signal to output the latched signal of the second pre-drive control signal as a second transmission drive control signal; and a first synthesis circuit configured to buffer the first transmission drive control signal to output the buffered signal of the first transmission drive control signal as the first command synthesis signal and configured to buffer the second transmission drive control signal to output the buffered signal of the second transmission drive control signal as the second command synthesis signal.

22. The semiconductor device of claim 18, wherein the strobe control signal synthesis circuit comprises:

a strobe signal shift circuit configured to shift the strobe control signal in synchronization with the second division clock signal to generate a transmission strobe control signal; and a second synthesis circuit configured to buffer the transmission strobe control signal to output the buffered transmission strobe control signal as the strobe synthesis signal.

* * * * *